United States Patent
Nakayama

(10) Patent No.: US 8,178,926 B2
(45) Date of Patent: May 15, 2012

(54) THIN FILM FIELD EFFECT TRANSISTOR AND DISPLAY

(75) Inventor: Masaya Nakayama, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 582 days.

(21) Appl. No.: 12/055,137

(22) Filed: Mar. 25, 2008

(65) Prior Publication Data

US 2008/0237598 A1    Oct. 2, 2008

(30) Foreign Application Priority Data

Mar. 27, 2007  (JP) ................ 2007-082859
Feb. 5, 2008   (JP) ................ 2008-025619

(51) Int. Cl.
*H01L 23/62* (2006.01)
(52) U.S. Cl. ............. 257/359; 257/43; 438/104
(58) Field of Classification Search ............ 257/43, 257/359; 438/104
See application file for complete search history.

(56) References Cited

U.S. PATENT DOCUMENTS

| 2003/0155594 A1 | 8/2003 | Ohnuma |
| 2005/0039670 A1 | 2/2005 | Hosono et al. |
| 2007/0069995 A1* | 3/2007 | Shin et al. ............ 345/76 |
| 2007/0108446 A1* | 5/2007 | Akimoto ............ 257/61 |
| 2010/0059746 A1* | 3/2010 | Itai ............ 257/43 |

FOREIGN PATENT DOCUMENTS

| JP | 60-160170 A | 8/1985 |
| JP | 61-5578 A | 1/1986 |
| JP | 62-42564 A | 2/1987 |
| JP | 63-258072 A | 10/1988 |
| JP | 2000-124456 | * 4/2000 |
| JP | 2006-165528 A | 6/2006 |
| JP | 2006-165529 A | 6/2006 |
| JP | 2007-73703 A | 3/2007 |
| WO | WO 2008/105250 A1 | 9/2008 |

OTHER PUBLICATIONS

M. tto et al., IDW/AD'05, Dec. 6, 2005, pp. 845-846.
Kenji Nomura et al., Nature, vol. 432, Nov. 25, 2004, pp. 488-492.

* cited by examiner

*Primary Examiner* — Telly Green
(74) *Attorney, Agent, or Firm* — Birch, Stewart, Kolasch & Birch, LLP.

(57) ABSTRACT

A thin film field effect transistor including, on a substrate, at least a gate electrode, a gate insulating layer, an active layer, a source electrode and a drain electrode, wherein an electric resistance layer is provided in electric connection between the active layer and at least one of the source electrode or the drain electrode.

13 Claims, 11 Drawing Sheets

THIN FILM FIELD EFFECT TRANSISTOR AND DISPLAY

CROSS-REFERENCE TO RELATED APPLICATION

This application claims priority under 35 USC 119 from Japanese Patent Application Nos. 2007-082859 and 2008-025619, the disclosures of which are incorporated by reference herein.

BACKGROUND OF THE INVENTION

1. Field of the Invention

The present invention relates to a thin film field effect transistor and a display using the same. Particularly, it relates to a thin film field effect transistor in which an amorphous oxide semiconductor is used for an active layer, and a display using the same.

2. Description of the Related Art

In recent years, flat panel displays (FPDs) have been put to practical use, due to the progress made in liquid crystal and electroluminescence (EL) technologies, etc. Especially, an organic electroluminescence element (hereinafter referred to as an "organic EL element") formed using a thin film material which emits light by excitation due to application of electric current can provide light emission of high brightness at a low voltage, and thus is expected to achieve reduction in device thickness, weight, and size, and power saving, etc. in wide ranging applications including mobile phone displays, personal digital assistants (PDA), computer displays, car information displays, TV monitors, and general illumination.

These FPDs are driven by an active matrix circuit including field effect-type thin film transistors each using, as an active layer, an amorphous silicon thin film or a polycrystalline silicon thin film provided on a glass substrate. (In the description below, the field effect-type thin film transistor is sometimes referred to as a "thin film transistor" or "TFT".)

On the other hand, to make the FPD thinner, lighter, and more resistant to breakage, attempts are being made to use a resin substrate which is light in weight and flexible instead of the glass substrate.

However, fabrication of the transistors using thin films of silicon described above requires a thermal treatment process at a relatively high temperature, and it is difficult to form the transistors directly on a resin substrate which is generally low in heat resistance.

Hence, such TFTs have been actively developed using, as a semiconductor thin film, a film of an amorphous oxide, such as an In—Ga—Zn—O-based amorphous oxide, which can be formed at a low temperature, as disclosed in Japanese Patent Application Laid-Open (JP-A) No. 2006-165529 and IDW/AD'05, pages 845-846 (Dec. 6, 2005).

As the films for a TFT made with an amorphous oxide semiconductor can be formed at room temperature, the TFT can be prepared on a film (flexible substrate). Therefore, amorphous oxide semiconductors have been attracting attention as a material for active layers of film (flexible) TFTs lately. Particularly, Prof. Hosono et al. of the Tokyo Institute of Technology have reported that a TFT formed using a-IGZO has a field effect mobility of about 10 $cm^2$/Vs even on a PEN substrate, which is higher than that of an a—Si TFT on glass. Since then, TFTs formed using an amorphous oxide semiconductor have especially drawn attention, especially as film TFTs. (See for example, *NATURE*, vol. 432, pages 488-492, Nov. 25, 2004.)

However, in the case of using, as for example, a drive Circuit of a display, a TFT formed using a-IGZO, there are the problems that mobility ranges from 1 $cm^2$/Vs to 10 $cm^2$/Vs, which provides insufficient performance, the OFF current is high, and the ON-OFF ratio is low. Particularly, in order to apply such a TFT to a display incorporating organic EL devices, further increase in mobility and improvement in ON-OFF ratio are required.

SUMMARY OF THE INVENTION

The present invention has been made in view of the above circumstances and provides a thin film field effect transistor and a display using the same with the following aspects.

A first aspect of the invention provides a thin film field effect transistor comprising at least a gate electrode, a gate insulating layer, an active layer, a source electrode and a drain electrode on a substrate, wherein an electric resistance layer is provided between the active layer and at least one of the source electrode or the drain electrode.

A second aspect of the invention provides a display comprising the thin film field effect transistor according to the first aspect.

DETAILED DESCRIPTION OF THE INVENTION

Figure 1:
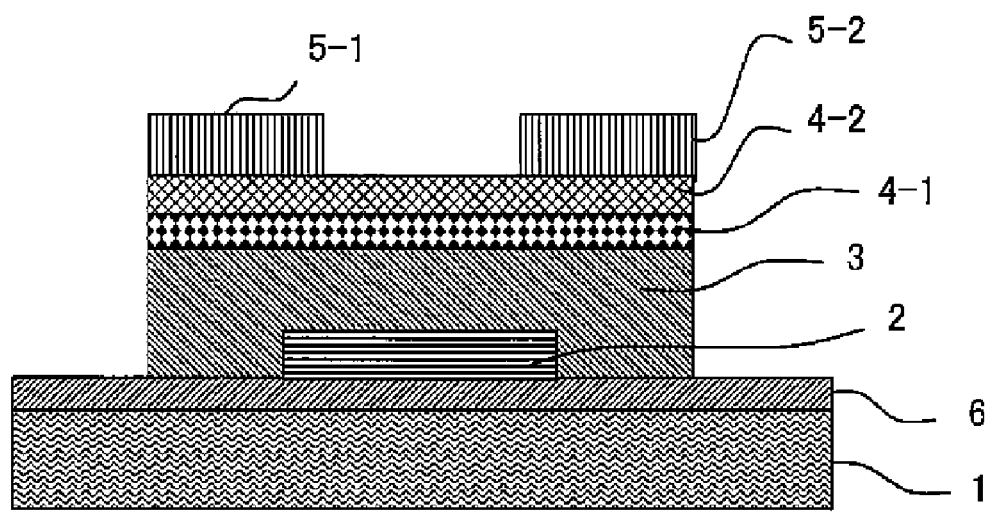
FIG. 1 is a schematic diagram showing the structure of a TFT device having reversed stagger structure according to the invention.

It is an object of the invention to provide a thin film field effect transistor using an amorphous oxide semiconductor which has high field effect mobility and a large ON-OFF ratio, and particularly, to provide a high-performance thin film field effect transistor which can be prepared on a flexible resin substrate.

Also, it is another object of the invention to provide a novel display using this thin film field effect transistor.

The problems described above have been solved by the following means.

The thin film field effect transistor of the invention is characterized in that, it includes at least a gate electrode, a gate insulating layer, an active layer, a source electrode and a drain electrode on a substrate, wherein an electric resistance layer is disposed between the active layer and at least one of the source electrode or the drain electrode.

Preferably, the electric resistance layer has an electric conductivity lower than that of the active layer.

Preferably, the active layer is in contact with the gate insulating layer, and the electric resistance layer is in contact with at least one of the source electrode or the drain electrode.

The electric resistance layer is preferably thicker than the active layer.

The electric conductivity preferably continuously changes in the active layer between the electric resistance layer and the active layer.

The active layer preferably includes an oxide semiconductor. More preferably, the oxide semiconductor is an amorphous oxide semiconductor.

The electric resistance layer preferably includes an oxide semiconductor. More preferably, the oxide semiconductor is an amorphous oxide semiconductor.

The electric resistance layer and the active layer preferably include an oxide semiconductor. More preferably, the oxide semiconductor is an amorphous oxide semiconductor. The active layer is preferably lower in oxygen concentration than the electric resistance layer. The oxide semiconductor preferably includes at least one material selected from a group consisting of indium, gallium and zinc, or a composite oxide of a combination of materials selected from the group consisting of indium, gallium and zinc. More preferably, the oxide semiconductor includes indium (In) and zinc (Zn), and the composition ratio of Zn to In (i.e., Zn/In) in the electric resistance layer is larger than that in the active layer.

The electric conductivity of the active layer is preferably $10^{-1}$ Scm$^{-1}$ or more and less than $10^2$ scm$^{-1}$.

Further, a ratio of the electric conductivity of the active layer to the electric conductivity of the electric resistance layer (i.e., the electric conductivity of the active layer divided/the electric conductivity of the electric resistance layer) is preferably from $10^2$ to $10^8$.

In addition, the substrate is preferably a flexible resin substrate.

An amorphous oxide semiconductor used in TFTs has been attracting attention as a material for an active layer of a film (flexible) TFT, because an amorphous oxide semiconductor film can be formed at room temperature, which allows a TFT to be prepared using a flexible plastic film as a substrate. Particularly, as disclosed in JP-A No. 2006-165529, it is reported that a TFT which is formed on a PET film and has good performance such as a field effect mobility of 10 cm$^2$/Vs and an ON-OFF ratio of over $10^3$ was achieved by using an In—Ga—Zn—O-based oxide as a semiconductor layer (i.e., an active layer). However, when such a TFT is used in a drive circuit of a display, the performance of this TFT is still insufficient with regard to mobility and ON-OFF ratio to operate the drive circuit.

The reason for this is as follows. In the conventional art, in order to reduce the OFF current, it is required that the concentration of electron carriers in the active layer is less than $10^{18}$/cm$^3$. However, an amorphous oxide semiconductor used for the active layer tends to have low electron mobility when the concentration of electron carriers is decreased, so that it has been difficult to form a TFT which can achieve both of good OFF characteristics and high mobility at the same time.

Hence, the inventors have conducted intensive research to find a means for increasing the field effect mobility of a TFT and improving the ON-OFF ratio. As a result, it was found that the problems can be solved by a thin film field effect transistor which has at least a gate electrode, a gate insulating layer, an active layer including an amorphous oxide semiconductor, a source electrode, and a drain electrode in this order, arranged so that an electric resistance layer is positioned between the active layer and at least one of the source electrode or the drain electrode, whereby the inventors achieved the present invention. Particularly, it was found that a layer arrangement wherein at least the electric resistance layer and the active layer are layered on the substrate, arranged so that the active layer is in contact with the gate insulating layer, and the electric resistance layer is in contact with at least one of the source electrode or the drain electrode, is an effective means.

According to the invention, it is possible to provide a thin film field effect transistor which exhibits high field effect mobility and a large ON-OFF ratio, and a display using such a thin film field effect transistor. Particularly, it is possible to provide a thin film field effect transistor which is useful as a film (flexible) TFT using a flexible substrate and a display using such a thin film field effect transistor.

1. Thin Film Field Effect Transistor

The thin film field effect transistor of the invention is an active device which has at least a gate electrode, a gate insulating layer, an active layer, a source electrode and a drain electrode in this order, and has the function of switching current between the source electrode and the drain electrode, in which the current passing through the active layer is controlled by applying voltage to the gate electrode. As the TFT structure, either of a stagger structure and a reversed stagger structure may be formed.

According to the invention, the active layer and an electric resistance layer are connected electrically, wherein the electric resistance layer is positioned between the active layer and at least one of the source electrode or the drain electrode, and an electric conductivity of the electric resistance layer is lower than that of the active layer.

Preferably, at least the electric resistance layer and the active layer are layered on the substrate, and the active layer is in contact with the gate insulating layer, and the electric resistance layer is in contact with at least one of the source electrode or the drain electrode.

Preferably, the electric conductivity of the active layer is $10^{-4}$ Scm$^{-1}$ or more and less than $10^2$ Scm$^{-1}$, and more preferably $10^{-1}$ Scm$^{-1}$ or more and less than $10^2$ Scm$^{-1}$. The electric conductivity of the electric resistance layer is lower than that of the active layer, and is preferably $10^{-2}$ Scm$^{-1}$ or less, and more preferably $10^{-9}$ Scm$^{-1}$ or more and less than $10^{-3}$ Scm$^{-1}$. More preferably, the ratio of the electric conductivity of the active layer to that of the electric resistance layer (i.e., the electric conductivity of the active layer/the electric conductivity of the electric resistance layer) is from $10^2$ to $10^8$.

In the case where the electric conductivity of the active layer is less than $10^{-4}$ Scm$^{-1}$, high field effect mobility can not be obtained. On the contrary, in the case where the electric conductivity of the active layer is $10^2$ Scm$^{-1}$ or more, OFF current is increased, and thus a good ON-OFF ratio cannot be obtained. Therefore, these conditions are not preferable.

Further, it is preferable in view of improvement in operation stability that the electric resistance layer is thicker than the active layer. More preferably, the ratio of the thickness of the electric resistance layer to that of the active layer is more than 1 and 100 or less, and even more preferably the ratio is more than 1 and 10 or less.

Also, another embodiment in which the electric conductivity continuously changes in the active layer between the electric resistance layer and the active layer is preferable.

In addition, in view of being able to form the active layer and the electric resistance layer at room temperature, it is preferable that these layers include an oxide semiconductor. It is more preferable that the oxide semiconductor is in an amorphous state.

Preferably, the oxide semiconductor included in the active layer is lower in oxygen concentration than the oxide semiconductor included in the electric resistance layer.

Preferably, the oxide semiconductor includes at least one material selected from the group consisting of indium (In), gallium (Ga) and zinc (Zn), or a composite oxide of a combination of materials selected from the group consisting of indium (In), gallium (Ga) and zinc (Zn). More preferably, the oxide semiconductor includes In and Zn, and the composition ratio of zinc to indium, i.e., Zn/In, in the electric resistance layer is larger than that in the active layer. The ratio of Zn/In of the electric resistance layer is preferably larger than that of the active layer by 3% or more, and more preferably larger by 10% or more.

It is preferable that the substrate is a flexible resin substrate.
1) Structure

Next, the structure of the thin film field effect transistor according to the invention will be described in detail with reference to the drawings.

FIG. 1 is a schematic diagram showing an example of the reversed stagger structure of the thin film field effect transistor of the invention. In the case where a substrate 1 is composed of a flexible substrate such as a plastic film or the like, the thin film field effect transistor has an insulating layer 6 disposed on one surface of the substrate 1, and on the insulating layer 6, a gate electrode 2, a gate insulating layer 3, an active layer 4-1, and an electric resistance layer 4-2 are stacked. On the surface of the structure thus constructed, a source electrode 5-1 and a drain electrode 5-2 are disposed. The active layer 4-1 borders on the gate insulating layer 3, and the electric resistance layer 4-2 borders on the source electrode 5-1 and the drain electrode 5-2. The compositions of the active layer 4-1 and electric resistance layer 4-2 are determined so that the electric conductivity of the active layer 4-1 is higher than that of the electric resistance layer 4-2 when no voltage is applied to the gate electrode. Incidentally, for the active layer, oxide semiconductors disclosed in JP-A No. 2006-165529, e.g., In—Ga—Zn—O-based oxide semiconductors, are used. It is known that in these oxide semiconductors, the higher the concentration of electron carriers is, the higher the electron mobility is. In other words, the higher the electric conductivity is, the higher the electron mobility is.

According to this structure of the invention, when the thin film field effect transistor in the ON state under the condition where voltage is applied to the gate electrode, the active layer which becomes a channel has high electric conductivity. As a result, the field effect mobility of the transistor is increased and a large ON current can be obtained. On the other hand, in the OFF state, the electric resistance layer has a high resistance because of its low electric conductivity, and the OFF current is kept low. Thus, the ON-OFF ratio is remarkably improved.

Figure 2:
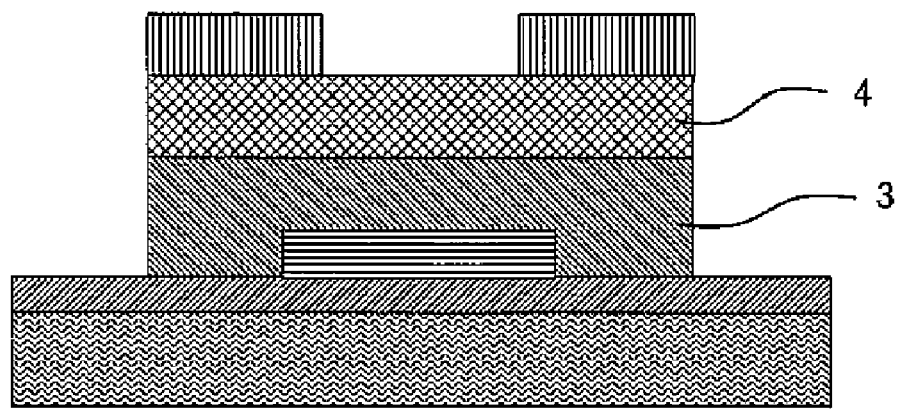
FIG. 2 is a schematic diagram showing the structure of a comparative example of a TFT device having reversed stagger structure.

FIG. 2 is a schematic diagram showing an example of a conventional thin film field effect transistor with a reversed stagger structure. The active layer 4 has no particular distribution of the electric conductivity in the direction of its thickness. With the conventional arrangement, the resistance value of the active layer 4 needs to be lowered to reduce OFF current, and it is required to decrease the carrier concentration of the active layer 4. JP-A No. 2006-165529 discloses that to achieve a good ON-OFF ratio, the concentration of electron carriers needs to be made less than $10^{18}$/cm$^3$, and more preferably less than $10^{16}$/cm$^3$ for reducing the electric conductivity of the amorphous oxide semiconductor of the active layer 4. However, as shown in FIG. 2 of JP-A No. 2006-165529, in In—Ga—Zn—O-based oxide semiconductors, a decrease in the concentration of electron carriers causes reduced electron mobility of the film. On this account, a field effect mobility of the TFT of 10 cm$^2$/Vs or higher cannot be obtained, and it is impossible to gain a sufficient ON current. Therefore, as to the ON-OFF ratio, sufficient characteristics cannot be obtained.

On the other hand, raising the concentration of electron carriers of the oxide semiconductor of the active layer 4 to increase the electron mobility of the film increases the electric conductivity of the active layer 4, increases the OFF current, and worsens the characteristics of ON-OFF ratio.

The point of the invention is to provide a semiconductor layer (the semiconductor layer in the present invention means a layer including an active layer and an electric resistance layer) whose electric conductivity near the gate insulating layer is higher than that near the source electrode and the drain electrode. However, this is not shown in the drawing. As long as this condition is achieved, the means for achieving this is not limited to providing a plurality of semiconductor layers as shown in FIG. 1. The electric conductivity may be changed continuously.

Figure 3:
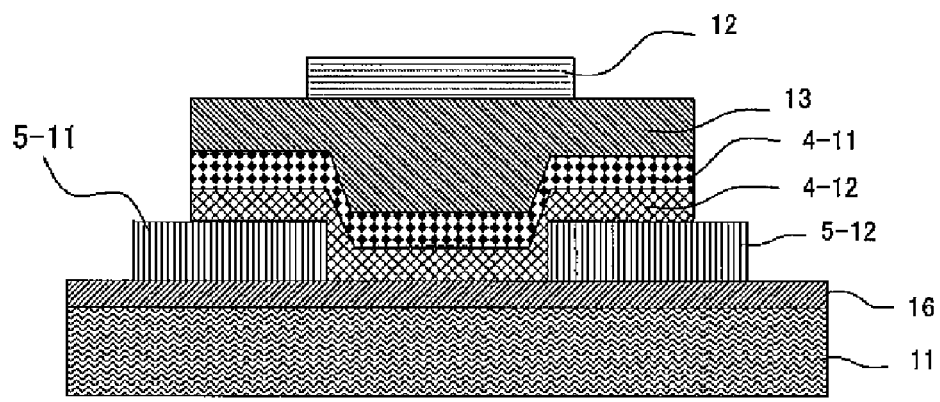
FIG. 3 is a schematic diagram showing the structure of a TFT device having top gate structure according to the invention.

FIG. 3 is a schematic diagram showing an example of the top gate structure of the thin film field effect transistor according to the invention. In the case where a substrate 11 is composed of a flexible substrate such as a plastic film or the like, the thin film field effect transistor has an insulating layer 16 disposed on one surface of the substrate 11, a source electrode 5-11 and a drain electrode 5-12 are provided on the insulating layer, an electric resistance layer 4-12 and an active layer 4-11 are stacked, and then a gate insulating layer 13 and a gate electrode 12 are provided. Similar to the case of the reversed stagger structure, the active layer 4-11 (which is a high-electric conductivity layer) borders on the gate insulating layer 13, and the electric resistance layer 4-12 (which is a low-electric conductivity layer) borders on the source electrode 5-11 and the drain electrode 5-12. The compositions of the active layer 4-11 and electric resistance layer 4-12 are determined so that the electric conductivity of the active layer 4-11 is higher than that of the electric resistance layer 4-12 when no voltage is applied to the gate electrode.

Figure 4:
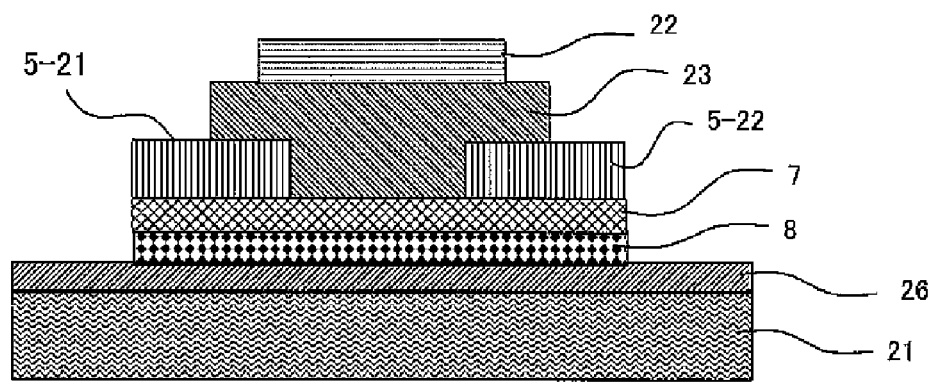
FIG. 4 is a schematic diagram showing the structure of a comparative example of a TFT device having top gate structure.

FIG. 4 is a schematic diagram showing an example of the structure of a thin film field effect transistor with top gate structure for comparison. As disclosed in JP-A No. 2006-165529, an active layer is composed of a high-oxygen-concentration layer 7 and a low-oxygen-concentration layer 8. The high-oxygen-concentration layer 7 is a layer with a low electron carrier concentration, i.e., a layer with low electric conductivity. The low-oxygen-concentration layer 8 is a layer with a high electron carrier concentration, i.e., a layer with high electric conductivity. In this structure for comparison, the active layer bordering the gate insulating layer 23, which becomes a channel, is low in both electron carrier concentration and electron mobility. Therefore, the structure cannot achieve high field effect mobility.

Figure 6:
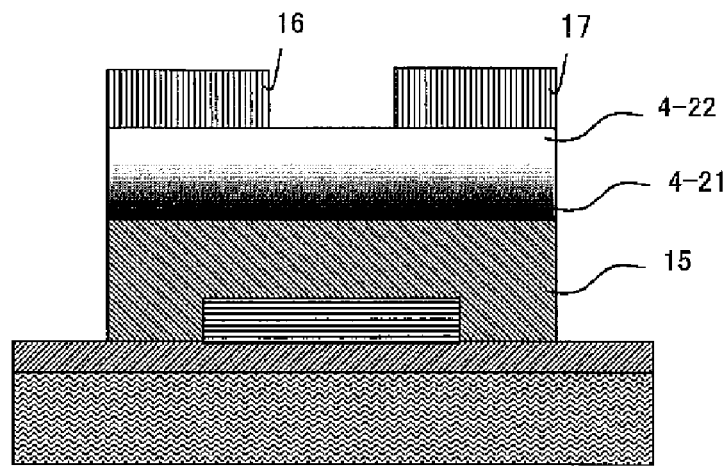
FIG. 6 is a schematic diagram showing a structure of a TFT device having reversed stagger structure, in which the electric conductivity of the active layer continuously changes in the layer, so that the electric conductivity becomes higher in a region closer to the gate insulating layer and lower in a region of an electric resistance layer closer to the source electrode and the drain electrode.

FIG. 6 is a schematic diagram showing an example of the top gate structure of another configuration of the thin film field effect transistor according to the invention. In this structure, the electric conductivity of the semiconductor layer continuously changes in the layer, so that the electric conductivity becomes higher in a region closer to the gate insulating layer and lower in a region closer to the source electrode and the drain electrode. The region of an active layer 4-21, which is close to the gate insulating layer 15, has high electric conductivity, and the region close to the source electrode 16 and drain electrode 17 has low electric conductivity and forms an electric resistance layer 4-22. A semiconductor layer with this structure can be prepared by continuously changing the sputtering conditions of the target compound during deposition of the semiconductor layer.

Figure 7:
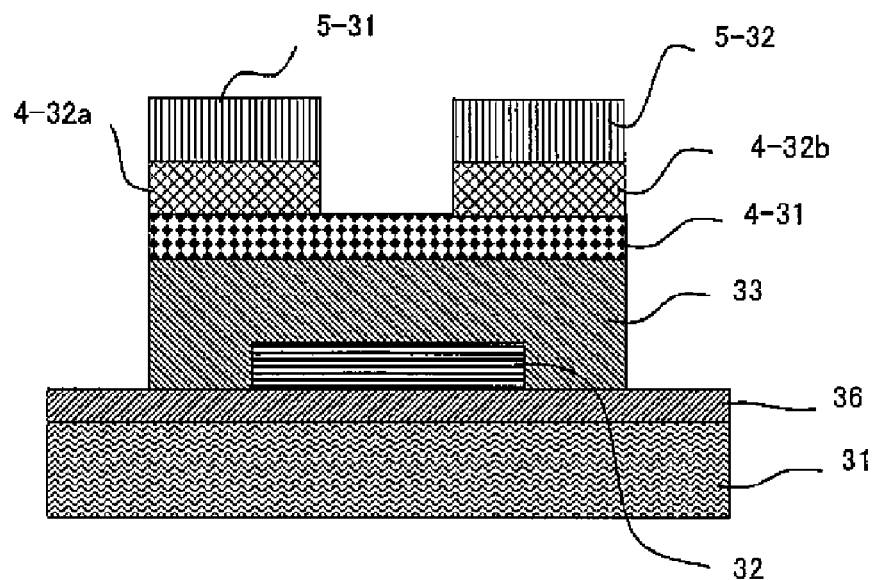
FIG. 7 is a schematic diagram showing the structure of a TFT device having reversed stagger structure according to another embodiment of the invention.

FIG. 7 is a schematic diagram showing, as an example of the reversed stagger structure of another configuration of the thin film field effect transistor according to the invention. An active layer 4-31 is formed on a gate insulating layer 33, and on the active layer 4-31 an electric resistance layer is stacked. The electric resistance layer is subjected to patterning so that electric resistance layers 4-32a and 4-32b are formed only in the areas corresponding to the places where a source electrode 5-31 and a drain electrode 5-32 are to be provided. When a channel is formed by application of voltage to the gate electrode, thereby bringing the transistor to the ON state, the field effect mobility of the transistor is made higher and thus a high ON current can be obtained because the active layer 4-31 forming the channel has high electric conductivity. In the OFF state where no voltage is applied to the gate electrode and no channel is formed, the OFF current is kept low because the electric resistance layers 4-32a and 4-32b with high electric resistance are interposed between the active layer 4-31 and both of the source electrode 5-31 and the drain electrode 5-32. Thus, the ON-OFF ratio is remarkably improved.

Figure 8:
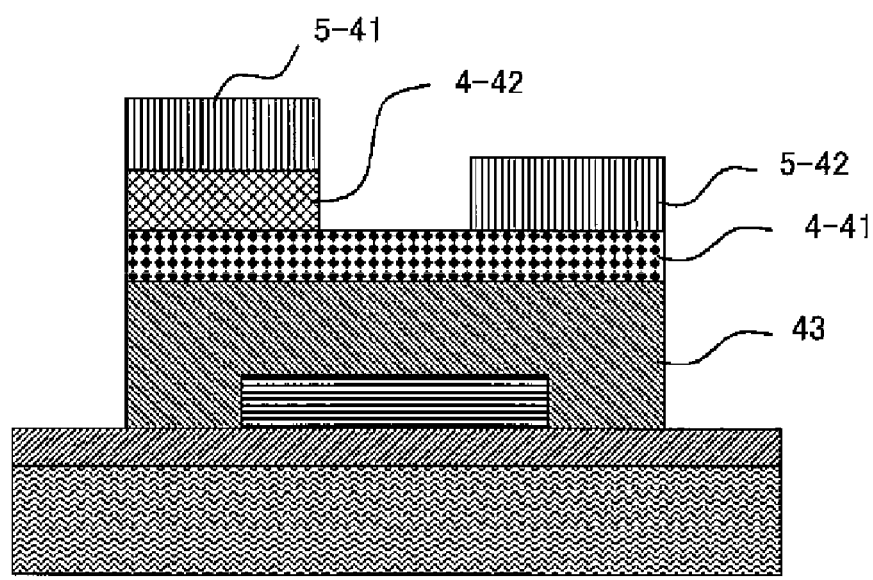
FIG. 8 is a schematic diagram showing the structure of a TFT device having reversed stagger structure according to another embodiment of the invention.

FIG. 8 is a schematic diagram showing a reversed stagger structure as another example of the thin film field effect transistor according to the invention. An active layer 4-41 is formed on a gate insulating layer 43, and an electric resistance layer 4-42 is stacked on the active layer 4-41. The electric resistance layer 4-42 is subjected to patterning so that the electric resistance layer 4-42 is formed only in the area corresponding to the place where a source electrode 5-41 is to be provided. When a channel is formed by application of voltage to the gate electrode, thereby bringing the transistor to the ON state, the field effect mobility of the transistor is made higher and thus a high ON current can be obtained because the active layer 4-41 which becomes the channel has high electric conductivity. In the OFF state where no voltage is applied to the gate electrode and no channel is formed, the OFF current is kept low because the electric resistance layer 4-42 which has higher electric resistance is interposed between the source electrode 5-41 and the active layer 4-41. Thus, the ON-OFF ratio is remarkably improved. Further, the source electrode 5-41 and the drain electrode 5-42 in the structure shown in FIG. 8 may be interchanged, of course; in this case, the drain electrode 5-42 is connected with the electric resistance layer 4-42.

Figure 9:
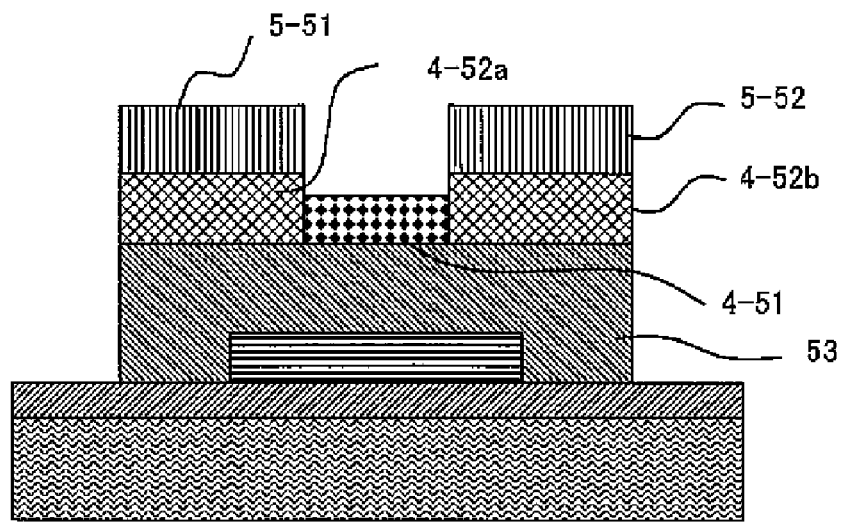
FIG. 9 is a schematic diagram showing the structure of a TFT device having reversed stagger structure according to another embodiment of the invention.

FIG. 9 is a schematic diagram showing a reversed stagger structure which is another example of the thin film field effect transistor according to the invention. On a gate insulating layer 53, electric resistance layers 4-52a and 4-52b, and an active layer 4-51 are stacked by patterning so that the electric resistance layers 4-52a and 4-52b are disposed in the areas corresponding to the places where a source electrode 5-51 and a drain electrode 5-52 are to be provided, and the active layer 4-51 is disposed between the electric resistance layers 4-52a and 4-52b. In other words, the active layer 4-51 is electrically connected to the source electrode 5-51 and the drain electrode 5-52 not directly, but indirectly through the electric resistance layers 4-52a and 4-52b.

When a channel is formed by application of voltage to the gate electrode, thereby bringing the transistor to the ON state, the field effect mobility of the transistor is made higher and thus a high ON current can be obtained because the active layer 4-51 which becomes the channel has high electric conductivity. In the OFF state where no voltage is applied to the gate electrode and no channel is formed, the electric resistance layers 4-52a and 4-52b which have high electric resistance keep the OFF current low. Thus, the ON-OFF ratio is remarkably improved.

Figure 10:
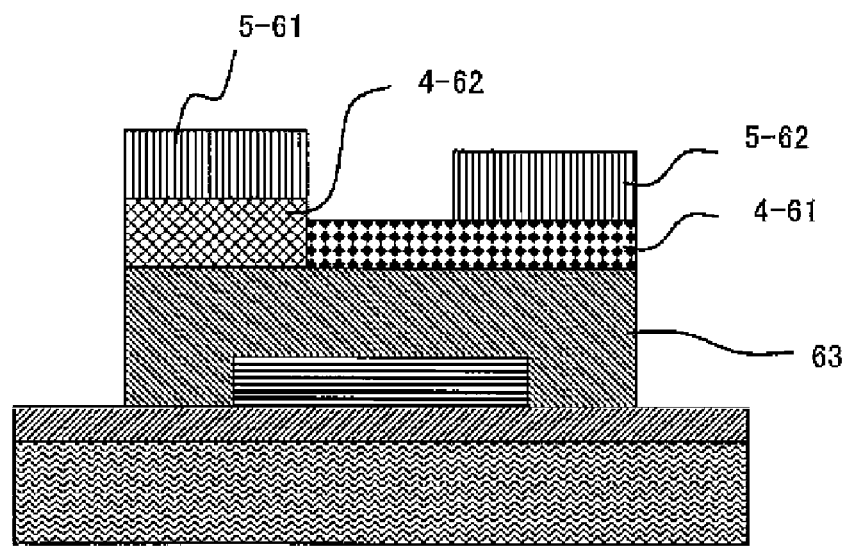
FIG. 10 is a schematic diagram of the structure of a TFT device having reversed stagger structure according to another embodiment of the invention.

FIG. 10 is a schematic diagram showing a reversed stagger structure which is another example of the thin film field effect transistor according to the invention. On a gate insulating layer 63, an electric resistance layer 4-62 and an active layer 4-61 are formed by patterning so that the electric resistance layer 4-62 lies in the area corresponding to the place where a source electrode 5-61 is to be provided, and the active layer 4-61 is located in an area other than the area where the electric resistance layer 4-62 is disposed. According to this arrangement, the active layer 4-61 is electrically connected to the source electrode 5-61 not directly, but indirectly through the electric resistance layer 4-62.

When a channel is formed by application of voltage to the gate electrode, thereby bringing the transistor to the ON state, the field effect mobility of the transistor is made higher and thus a high ON current can be obtained because the active layer 4-61 which becomes the channel has high electric conductivity. In the OFF state where no voltage is applied to the gate electrode and no channel is formed, the electric resistance layer 4-62 which has high electric resistance keeps the OFF current low. Thus, the ON-OFF ratio is remarkably improved. Further, the source electrode 5-61 and drain electrode 5-62 in the structure shown in FIG. 10 may be interchanged, of course; in this case, the drain electrode 5-62 is connected with the electric resistance layer 4-62.

Figure 11:
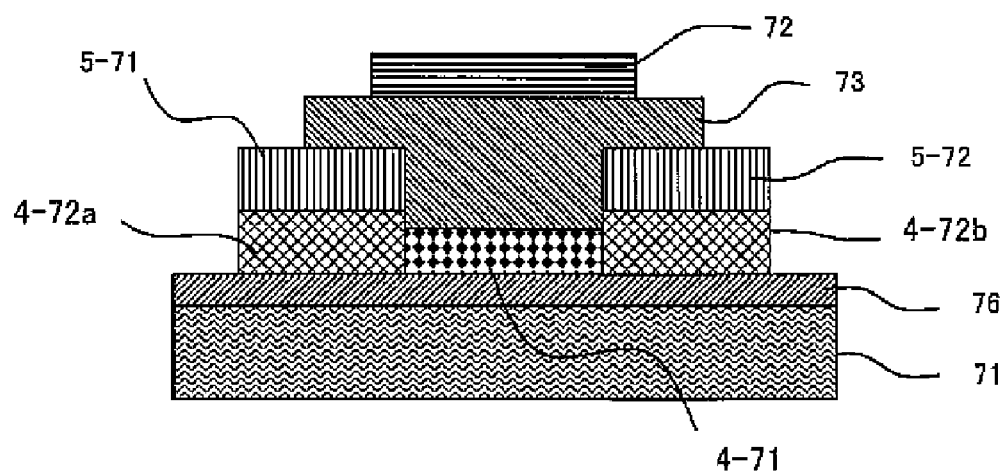
FIG. 11 is a schematic diagram showing the structure of a TFT device having top gate structure according to another embodiment of the invention.

FIG. 11 is a schematic diagram showing a top gate structure which is another example of the thin film field effect transistor according to the invention. On an insulating layer 76, electric resistance layers 4-72a and 4-72b, and an active layer 4-71 are formed. The electric resistance layers 4-72a and 4-72b are formed by patterning so as to lie in the areas corresponding to the places where a source electrode 5-71 and a drain electrode 5-72 are to be provided. The active layer 4-71 is formed by patterning so as to be located in an area other than the places where the electric resistance layers 4-72a and 4-72b are disposed. According to this arrangement, the active layer 4-71 is electrically connected to the source electrodes 5-71 and the drain electrode 5-72 not directly, but indirectly through the electric resistance layers 4-72a and 4-72b.

When a channel is formed by application of voltage to the gate electrode, thereby bringing the transistor to the ON state, the field effect mobility of the transistor is made higher and thus a high ON current can be obtained because the active layer 4-71 which becomes the channel has high electric conductivity. In the OFF state where no voltage is applied to the gate electrode and no channel is formed, the electric resistance layers 4-72a and 4-72b which have high electric resistance keep the OFF current low. Thus, the ON-OFF ratio is remarkably improved.

Figure 12:
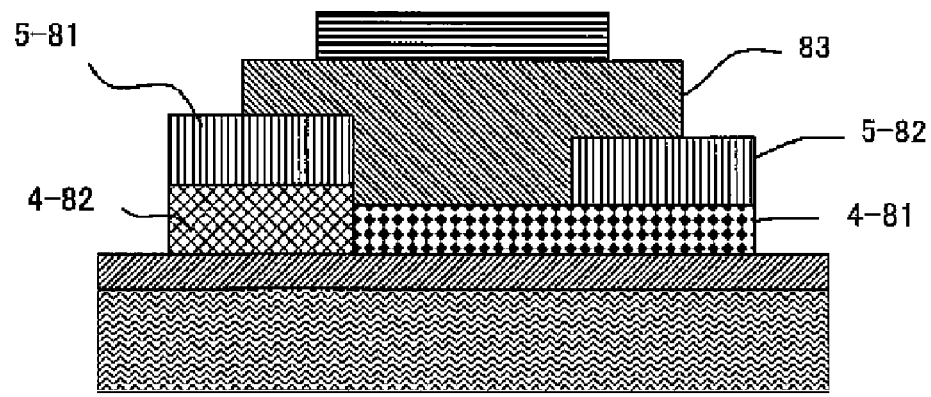
FIG. 12 is a schematic diagram showing the structure of a TFT device having top gate structure according to another embodiment of the invention.

FIG. 12 is a schematic diagram showing an example of top gate structure which is another example of the thin film field effect transistor according to the invention. An electric resistance layer 4-82 and an active layer 4-81 are formed by patterning so that the electric resistance layer 4-82 lies in the area corresponding to the place where the source electrode 5-81 is to be provided, and the active layer 4-81 is located in an area other than the place where the electric resistance layer 4-82 is disposed. According to this arrangement, the active layer 4-81 is electrically connected to the source electrode 5-81 not directly, but indirectly through the electric resistance layer 4-82.

When a channel is formed by application of a voltage to the gate electrode, thereby bringing the transistor to the ON state, the field effect mobility of the transistor is made higher and thus a high ON current can be obtained because the active layer 4-81 which becomes the channel has high electric conductivity. In the OFF state where no voltage is applied to the gate electrode and no channel is formed, the electric resistance layer 4-82 which has high electric resistance keeps the OFF current low. Thus, the ON-OFF ratio is remarkably improved. Further, the source electrode 5-81 and a drain electrode 5-82 in the structure shown in FIG. 12 may be interchanged, of course; in this case, the drain electrode 5-82 is connected with the electric resistance layer 4-82.

Figure 13:
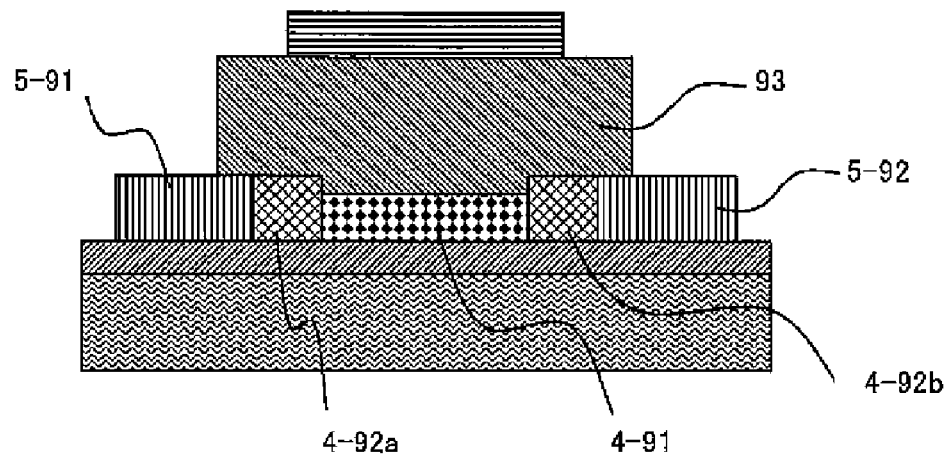
FIG. 13 is a schematic diagram showing the structure of a TFT device having top gate structure according to another embodiment of the invention.

FIG. 13 is a schematic diagram showing an example of top gate structure which is another example of the thin film field effect transistor according to the invention. On an insulating layer, electric resistance layers 4-92a and 4-92b, and an active layer 4-91 are formed by patterning so that they are arrayed, in a direction parallel with a surface of a substrate in the order of a source electrode 5-91, the electric resistance layer 4-92a, the active layer 4-91, the electric resistance layer 4-92b, and a drain electrode 5-92. According to this arrangement, the active layer 4-91 is electrically connected to the source electrode 5-91 and the drain electrode 5-92 not directly, but indirectly through the electric resistance layers 4-92a and 4-92b.

When a channel is formed by application of voltage to the gate electrode, thereby bringing the transistor to the ON state, the field effect mobility of the transistor is made higher and thus a high ON current can be obtained because the active layer 4-91 which becomes the channel has high electric conductivity. In the OFF state where no voltage is applied to the gate electrode and no channel is t formed, the electric resistance layers 4-92a and 4-92b which have high electric resistance keep the OFF current low. Thus, the ON-OFF ratio is remarkably improved.

Figure 14:
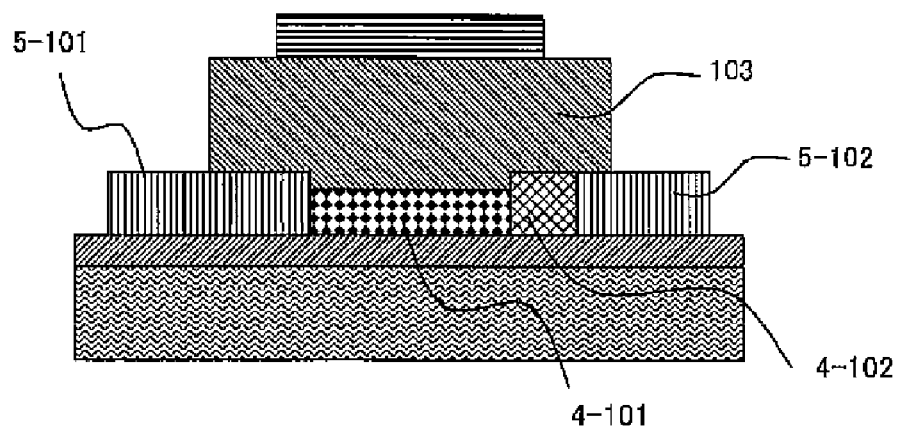
FIG. 14 is a schematic diagram showing the structure of a TFT device having top gate structure according to another embodiment of the invention.

FIG. 14 is a schematic diagram showing a top gate structure which is another example of the thin film field effect transistor according to the invention. On an insulating layer, an electric resistance layer 4-102 and an active layer 4-101 are formed by patterning so that they are arrayed, in a direction parallel with a surface of a substrate, in the order of a source electrode 5-101, the active layer 4-101, the electric resistance layer 4-102, and a drain electrode 5-102. According to this arrangement, the active layer 4-101 is electrically connected to the drain electrode 5-102 not directly, but indirectly through the electric resistance layer 4-102.

When a channel is formed by application of voltage to the gate electrode, thereby bringing the transistor to the ON state, the field effect mobility of the transistor is made higher and thus a high ON current can be obtained because the active layer 4-101 which becomes the channel has high electric conductivity. In the OFF state where no voltage is applied to the gate electrode and no channel is formed, the electric resistance layer 4-102 which has high electric resistance keeps the OFF current low. Thus, the ON-OFF ratio is remarkably improved. Incidentally, the source electrode 5-101 and the drain electrode 5-102 may be replaced with each other in the structure shown in FIG. 14, of course; in this case, the source electrode 5-101 is connected with the electric resistance layer 4-102.

Figure 15:
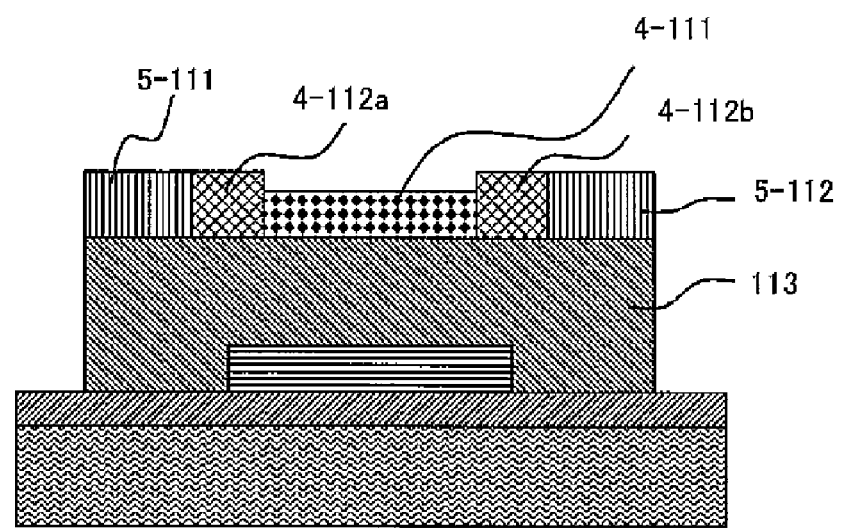
FIG. 15 is a schematic diagram of the structure of a TFT device having reversed stagger structure according to another embodiment of the invention.

FIG. 15 is a schematic diagram showing, as an example of the reversed stagger structure, another structure of the thin film field effect transistor according to the invention. On a gate insulating layer 113, electric resistance layers 4-112a and 4-112b and an active layer 4-111 are formed by patterning so that they are arrayed, in a direction parallel with a surface of a substrate, in the order of a source electrode 5-111, the electric resistance layer 4-112a, the active layer 4-111, the electric resistance layer 4-112b, and a drain electrode 5-112. According to this arrangement, the active layer 4-111 is electrically connected to the source electrode 5-111 and the drain electrode 5-112 not directly, but indirectly through the electric resistance layers 4-112a and 4112b.

When a channel is formed by application of voltage to the gate electrode, thereby bringing the transistor to the ON state, the field effect mobility of the transistor is made higher and thus a high ON current can be obtained because the active layer 4-111 which becomes the channel has high electric conductivity. In the OFF state where no voltage is applied to the gate electrode and no channel is formed, the electric resistance layers 4-112a and 4-112b which have high electric resistance keep the OFF current low. Thus, the ON-OFF ratio is remarkably improved.

Figure 16:
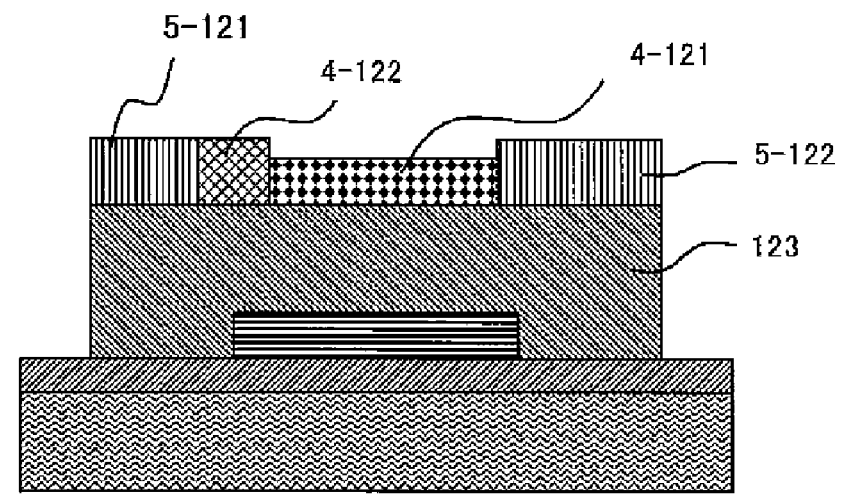
FIG. 16 is a schematic diagram of the structure of a TFT device having reversed stagger structure according to another embodiment of the invention.

FIG. 16 is a schematic diagram showing, as an example of the reversed stagger structure, another structure of the thin film field effect transistor according to the invention. On a gate insulating layer, an electric resistance layer 4-122 and an active layer 4-121 are formed by patterning so that they are arrayed, in a direction parallel with a surface of a substrate, in the order of a source electrode 5-121, the electric resistance layer 4-122, the active layer 4-121, and a drain electrode 5-122. According to this arrangement, the active layer 4-121 is electrically connected to the source electrode 5-121 not directly, but indirectly through the electric resistance layer 4-122.

When a channel is formed by application of voltage to the gate electrode, thereby bringing the transistor to the ON state, the field effect mobility of the transistor is made higher and thus a high ON current can be obtained because the active layer 4-121 which becomes the channel has high electric conductivity. In the OFF state where no voltage is applied to the gate electrode and no channel is formed, the electric resistance layer 4-122 which has high electric resistance keeps the OFF current low. Thus, the ON-OFF ratio is remarkably improved. Further, the source electrode 5-121 and drain electrode 5-122 in the structure shown in FIG. 16 may be interchanged, of course; in this case, the drain electrode 5-122 is connected with the electric resistance layer 4-122.

Figure 17:
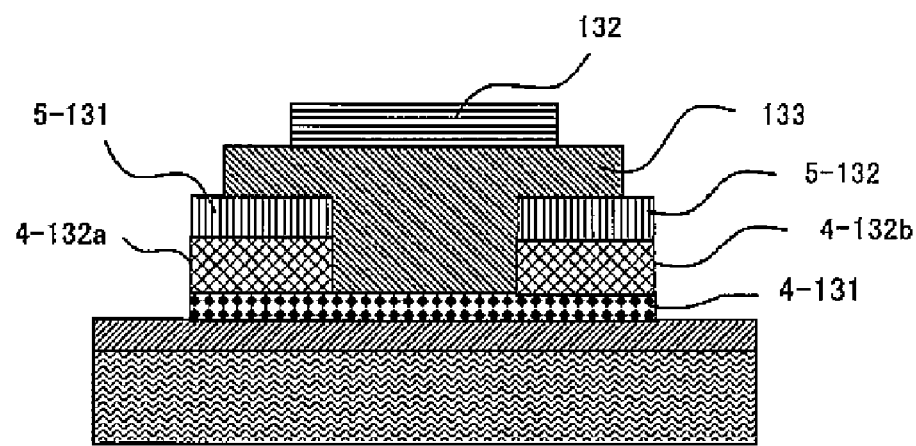
FIG. 17 is a schematic diagram of the structure of a TFT device having top gate structure according to another embodiment of the invention.

FIG. 17 is a schematic diagram showing a top gate structure which is another example of the thin film field effect transistor according to the invention. On an insulating layer, an active layer 4-131 is formed, and electric resistance layers 4-132a and 4-132b are formed on the active layer 4-131 by patterning so that the electric resistance layer 4-132a is disposed between a source electrode 5-131 and the active layer 4-131, and the electric resistance layer 4-132b is disposed between a drain electrode 5-132 and the active layer 4-131. According to this arrangement, the active layer 4-131 is electrically connected to the source electrode 5-131 and the drain electrode 5-132 not directly, but indirectly through the electric resistance layers 4-132a and 4-132b. Thus, the advantage of the invention described above can be obtained in a similar manner.

Figure 18:
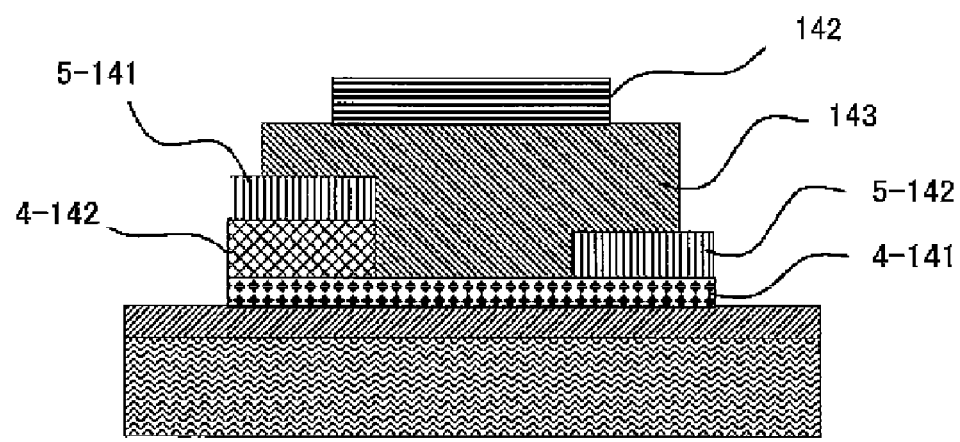
FIG. 18 is a schematic diagram of the structure of a TFT device having top gate structure according to another embodiment of the invention.

FIG. 18 is a schematic diagram showing a top gate structure which is another example of the thin film field effect transistor according to the invention. On an insulating layer, an active layer 4-141 is formed, and an electric resistance layer 4-142 is formed on the active layer 4-141 by patterning so as to be disposed between a source electrode 5-141 and the active layer 4-141. According to this arrangement, the active layer 4-141 is electrically connected to the source electrode 5-141 not directly, but indirectly through the electric resistance layer 4-142. Thus, the advantage of the invention described above can be obtained in a similar manner. Further, the source electrode 5-141 and drain electrode 5-142 in the structure shown in FIG. 18 may be interchanged, of course; in this case, the drain electrode 5-142 is connected with the electric resistance layer 4-142.

Figure 19:
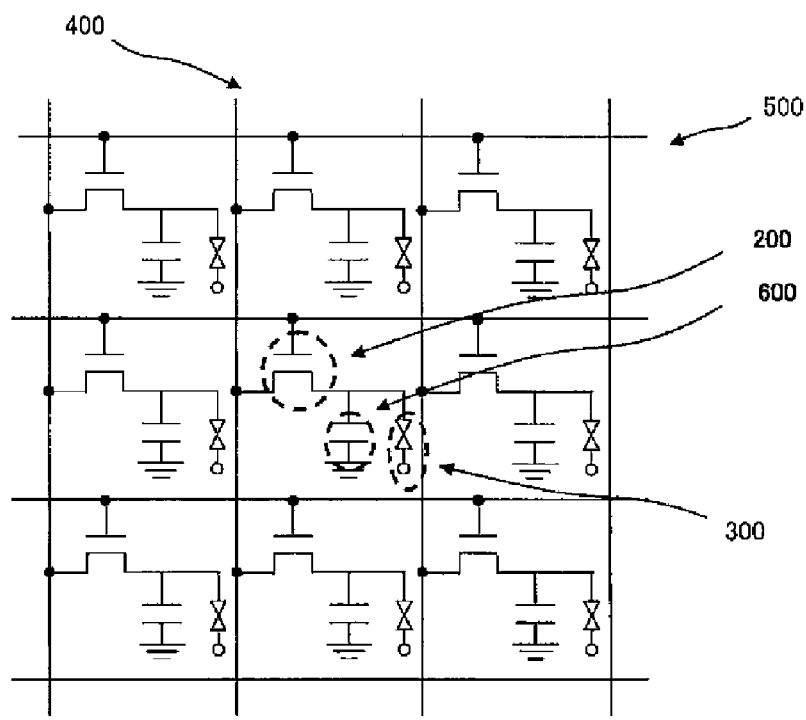
FIG. 19 is a schematic diagram of an equivalent circuit of an active matrix-driving type liquid crystal display using the TFT device according to the invention.
Figure 20:
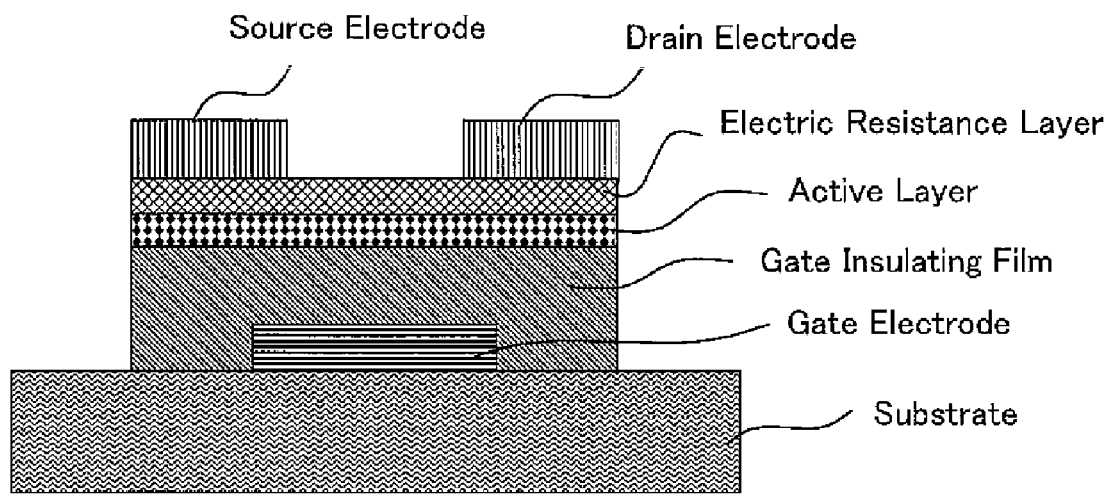
FIG. 20 is a schematic diagram showing the cross-sectional structure of a TFT device of Examples 1 to 3.

FIG. 19 is a schematic diagram of an equivalent circuit of an active matrix-driving type liquid crystal display which uses TFT devices according to the invention. The circuit of the display according to the invention is not particularly limited to that shown in FIG. 19. A circuit which is conventionally known in the art may be applied as-is.

2) Electric Conductivity

Now, the electric conductivity of the active layer and the electric resistance layer in association with the invention will be explained.

The electric conductivity is a physical property which indicates how much electricity a substance can conduct. When the carrier concentration of a substance is denoted by n, and the carrier mobility is denoted by μ, the electric conductivity a of the substance is expressed as follows.

$$\sigma = ne\mu$$

When the active layer or the electric resistance layer is composed of an n-type semiconductor, the carrier is an electron. In this case, the carrier concentration refers to the concentration of electron carriers, and the carrier mobility refers to the electron mobility. Conversely, when the active layer or the electric resistance layer is a p-type semiconductor, the carrier is a hole. In this case, the carrier concentration refers to the concentration of hole carriers, and the carrier mobility refers to the hole mobility. Further, the carrier concentration and carrier mobility of a substance can be determined by Hall measurements.

<Method of Determining Electric Conductivity>

The electric conductivity of a film can be determined by measuring the sheet resistance of the film, provided that the thickness of the film is known. The electric conductivity of a semiconductor changes depending on the temperature, and the electric conductivity cited herein refers to the electric conductivity at room temperature (20° C.).

3) Gate Insulating Layer

For the gate insulating layer, an insulator such as $SiO_2$, $SiN_x$, SiON, $Al_2O_3$, $Y_2O_3$, $Ta_2O_5$, $HfO_2$ and the like, or a mixed crystal compound containing at least two of these is used. Also, a polymeric insulator such as polyimide may be used for the gate insulating layer.

It is preferable that the gate insulating layer has a thickness from 10 nm to 10 μm. To reduce the leak current and raise the voltage resistance, it is required to make the gate insulating layer thicker to a certain extent. However, an increase in the thickness of the gate insulating layer results in a rise in the voltage needed for driving the TFT. Therefore, it is preferable that the thickness of the gate insulating layer is from 50 nm to 1000 nm for an inorganic insulator, and from 0.5 μm to 5 μm for a polymeric insulator. Especially, it is particularly preferable to use an insulator with a high dielectric constant, such as $HfO_2$, for the gate insulating layer, because then the TFT can be driven with low voltage even when it is made thicker.

4) Active Layer and Electric Resistance Layer

For the active layer and the electric resistance layer in this invention, it is preferable to use an oxide semiconductor. Particularly, an amorphous oxide semiconductor is preferable. Film of oxide semiconductors, particularly amorphous oxide semiconductors, can be formed at a low temperature, and so can be prepared on a flexible substrate made of a resin such as plastic. Satisfactory amorphous oxide semiconductors which can be prepared at a low temperature include an oxide containing In, an oxide containing In and Zn, and an oxide containing In, Ga and Zn, as disclosed in JP-A No. 2006-165529. Considering their compositional structures, it is known that amorphous oxide semiconductors of $InGaO_3(ZnO)_m$ (m is a natural number less than 6) are preferable. These oxide semiconductors are n-type semiconductors, in which electrons serve as carriers. Of course, p-type oxide semiconductors such as $ZnO/Rh_2O_3$, $CuGaO_2$, and $SrCu_2O_2$ may be used for the active layer and the electric resistance layer.

Specifically, an amorphous oxide semiconductor according to the invention preferably has a constitution including In—Ga—Zn—O. The amorphous oxide semiconductor is preferably an amorphous oxide semiconductor with a composition of $InGaO_3(ZnO)_m$ (m is a natural number less than 6) in a crystalline state. Particularly, $InGaZnO_4$ is more preferable. An amorphous oxide semiconductor of such composition has a feature that the electron mobility tends to increase with an increase in the electric conductivity. In addition, as to the control of the electric conductivity, it is disclosed in JP-A No. 2006-165529 that the electric conductivity can be controlled by controlling the partial pressure of oxygen during the film formation.

As a matter of course, not only oxide semiconductors, but also inorganic semiconductors such as Si and Ge, compound semiconductors such as GaAs, and organic semiconductor materials such as pentacene, polythiophene, and carbon nanotube, and the like can be used for the active layer and the electric resistance layer.

<Electric Conductivity of Active Layer and Electric Resistance Layer>

The active layer of the invention is characterized in that it is near the gate insulating layer, and the electric conductivity thereof is higher than that of the electric resistance layer which is near the source electrode and the drain electrode.

The ratio of the electric conductivity of the active layer to the electric conductivity of the electric resistance layer (i.e., the electric conductivity of the active layer divided by the electric conductivity of the electric resistance layer) is preferably from $10^1$ to $10^{10}$, and more preferably from $10^2$ to $10^8$. The electric conductivity of the active layer is preferably $10^{-4}$ $Scm^{-1}$ or more and less than $10^{-2}$ $Scm^{-1}$, and more preferably $10^{-1}$ $Scm^{-1}$ or more and less than $10^2$ $Scm^{-1}$.

The electric conductivity of the electric resistance layer is preferably $10^{-2}$ $Scm^{-1}$ or less, and more preferably $10^{-9}$ $Scm^{-1}$ or more and less than $10^{-3}$ $Scm^{-1}$.

<Thickness of Active Layer and Electric Resistance Layer>

It is preferable that the electric resistance layer is thicker than the active layer. More preferably, the ratio of a thickness of the electric resistance layer to that of the active layer is more than 1 and 100 or less, and even more preferably the ratio is more than 1 and 10 or less.

Preferably, the thickness of the active layer is from 1 nm to 100 nm, and more preferably, from 2.5 nm to 30 nm. Preferably, the thickness of the electric resistance layer is from 5 nm to 500 nm, and more preferably, from 10 nm to 100 nm.

Use of the active layer and the electric resistance layer arranged as described above achieves a TFT characterized by an ON-OFF ratio of $10^6$ or higher and high mobility of 10 $cm^2/V/sec$ or higher.

<Means for adjusting electric conductivity> In the case where the active layer and the electric resistance layer are composed of an oxide semiconductor, the means for adjusting the electric conductivity are what are described in the following items (1) to (4).

(1) Adjustment by Oxygen Defect

It is known that when an oxygen vacancy is made in oxide semiconductors, a carrier electron is generated, which results in an increase in the electric conductivity. Hence, the electric conductivity of an oxide semiconductor can be controlled by adjusting the quantity of oxygen vacancies. Specifically, means for controlling the quantity of oxygen vacancies include adjusting the partial pressure of oxygen during the time of film formation, and oxygen concentration and treatment time of an after-treatment after the film formation. Specifically, examples of this after-treatment include heat treatment at a temperature of 100° C. or higher, processing by oxygen plasma, and UV ozone treatment. Among these, the method involving controlling the partial pressure of oxygen during the time of film formation is preferable in view of its productivity. It has been disclosed in JP-A No. 2006-165529 that the electric conductivity of an oxide semiconductor can be controlled by adjusting the partial pressure of oxygen during the time of film formation, and therefore this method is usable.

(2) Adjustment by Composition Ratio

It has been known that the electric conductivity can be changed by changing the composition ratio of metals of an oxide semiconductor. For instance, it has been disclosed in JP-A No. 2006-165529 that in the case of $InGaZn_{1-x}Mg_xO_4$, the electric conductivity lowers with an increase in the percentage of Mg. In addition, it has been reported that the electric conductivity of oxides of $(In_2O_3)_{1-x}(ZnO)_x$ lowers with an increase in the percentage of Zn when the Zn/In ratio is 10% or higher ("*TOMEI DOUDENMAKU NO SINTENKAI II* (*Developments of Transparent Conductive Films II*)", pages 34-35, CMC Publishing CO., LTD.). Specifically, means for changing the composition ratio for example in the case of a method of forming a film by sputtering include a means using targets with different composition ratios. Alternatively, multiple targets may be cosputtered, changing the composition ratio of the resultant film by individually adjusting the sputtering rates for the targets.

(3) Adjustment by Impurities

It has been disclosed in JP-A No. 2006-165529 that when elements such as La, Na, Mn, Ni, Pd, Cu, Cd, C, N, and P are selectively added to an oxide semiconductor as an impurity, the concentration of electron carriers can be reduced, and therefore the electric conductivity can be made lower. Means for adding an impurity include co-vapor deposition of the oxide semiconductor and the impurity, and ion-doping of an oxide semiconductor film which has already been formed with ions of the impurity element.

(4) Adjustment by Oxide Semiconductor Material

While in the above items (1) to (3), the methods of adjusting the electric conductivity of the same oxide semiconductor system have been described, the electric conductivity can be changed by changing the oxide semiconductor material. It is known that the electric conductivity of $SnO_2$-based oxide semiconductors is lower than $In_2O_3$-based oxide semiconductors. In this way, the electric conductivity can be adjusted by changing the oxide semiconductor material. In particular, as the oxide materials having low electric conductivity, oxide insulator materials such as $Al_2O_3$, $Ga_2O_3$, $ZrO_2$, $Y_2O_3$, $Ta_2O_3$, $MgO$, $HfO_3$, and the like are known, and it is possible to use these materials.

As the means for adjusting the electric conductivity, the means stated in the above (1) to (4) may be used independently or in combination.

<Method of Forming Active Layer and Electric Resistance Layer>

As the means for forming a film of the active layer and the electric resistance layer, it is suitable to adopt a vapor-phase film forming method using, as a target, a polycrystalline sintered compact of an oxide semiconductor. Among the vapor-phase film forming methods, sputtering method and pulsed laser deposition method (PLD method) are adequate. For mass production, sputtering method is preferable.

For instance, by an RF magnetron sputtering deposition method, a film can be formed while controlling the vacuum level and flow rate of oxygen. The higher the flow rate of oxygen is, the lower the electric conductivity can be made.

It can be verified by conventional X-ray diffraction that the resultant film is an amorphous film.

The thickness of the film can be determined by contact stylus-type surface profile measurement. The composition ratio can be determined by RBS analysis (Rutherford Backscattering Spectrometry).

5) Gate Electrode

According to the invention, the following materials are among those which are preferable for the gate electrode: a metal such as Al, Mo, Cr, Ta, Ti, Au or Ag, an alloy such as Al—Nd or APC; a metal oxide conductive film of e.g., tin oxide, zinc oxide, indium oxide, indium-tin oxide (ITO), or indium-zinc oxide (IZO); an organic conductive compound such as polyaniline, polythiophene, or polypyrrole; or a mixture thereof.

The thickness of the gate electrode is preferably from 10 nm to 1000 nm.

The method of forming the electrode is not particularly limited. The film can be formed on the substrate according to a method which is appropriately selected from among wet methods such as a printing method and a coating method, physical methods such as a vacuum deposition method, a sputtering method and an ion plating method, chemical methods such as a CVD and plasma CVD method, and the like in consideration of the suitability with the material described above. For example, when ITO is selected, the film can be formed according to a DC or RF sputtering method, a vacuum deposition method, or an ion plating method. Further, in the case where an organic conductive compound is selected as the material of the gate electrode, the film formation can be performed according to a wet film-forming method.

6) Source Electrode and Drain Electrode

According to the invention, the following are suitable for the material of the source electrode and the drain electrode: metals such as Al, Mo, Cr, Ta, Ti, Au and Ag; alloys such as Al—Nd and APC; metal oxide conductive films of, for example, tin oxide, zinc oxide, indium oxide, indium-tin oxide (ITO) and indium-zinc oxide (IZO); and organic conductive compounds such as polyaniline, polythiophene and polypyrrole, and mixtures thereof.

The thickness of the source electrode and the drain electrode is preferably from 10 nm to 1000 nm.

The method of forming the electrodes is not particularly limited. The films can be formed on the substrate according to a method which is appropriately selected from among wet methods such as a printing method and a coating method, a physical methods such as a vacuum deposition method, a sputtering method and an ion plating method, a chemical methods such as a CVD and plasma CVD method, and the like in consideration of the suitability with the material described above. For example, when ITO is selected, the films can be formed according to a DC or RF sputtering method, a vacuum deposition method, an ion plating method, etc. Further, in the case where an organic conductive compound is selected as the material of the source electrode and the drain electrode, the film formation can be performed according to a wet film-forming method.

7) Substrate

According to the invention, the substrate used herein is not particularly limited. The following materials are for example suitable for the substrate: inorganic materials such as YSZ (zirconia stabilized yttrium) and glass; and organic materials including polyesters such as polyethylene terephthalate, polybutylene terephthalate and polyethylene naphthalate, and synthetic resins such as polystyrene, polycarbonate, polyether sulfone, polyarylate, allyl diglycol carbonate, polyimide, polycycloolefin, norbornene resin, and polychlorotrifluoroethylene. In the case of the organic materials described above, a material superior in heat resistance, stability of dimension, resistance to solvents, electric insulating property, workability, low gas permeability, low hygroscopicity, and the like is preferable for the substrate.

According to the invention, it is particularly preferable to use a flexible substrate. As for the material used for the flexible substrate, an organic plastic film which has high transmittance is preferable. For instance, the following materials can be used: polyesters such as polyethylene terephthalate, polybutylene phthalate and polyethylene naphthalate; and plastic films such as polystyrene, polycarbonate, polyether sulfone, polyarylate, polyimide; polycycloolefin, norbornene, and polychlorotrifluoroethylene. Also, it is preferable that such film-shaped plastic substrate has an insulating layer in the case where the insulation is insufficient, a gas-barrier layer for preventing moisture and oxygen from penetrating through the substrate, an undercoat layer for enhancing the planarity and the adhesion with the electrode or active layer of the film-shaped plastic substrate, or the like It is preferable that the thickness of the flexible substrate is from 50 nm to 500 μm. The reason for this is that when the thickness of the flexible substrate is less than 50 μm, it is hard for the substrate to maintain sufficient planarity itself, and when the flexible substrate is thicker than 500 μm, it becomes difficult to bend the substrate itself freely, i.e., the flexibility of the substrate becomes insufficient.

8) Protective Insulating Film

If necessary, a protective insulating film may be provided on TFT.

The protective insulating film has a function to protect semiconductor layers including active layers and electric resistance layers from deterioration by air, and to insulate a device formed on TFT from TFT.

Specific examples of materials for the protective insulating film include metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AiF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective insulating film. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

9) After Treatment

If necessary, heating treatment may be conducted as an after treatment for TFT. The heating treatment is performed under air or nitrogen environment at 100° C. or higher. The heating treatment may be conducted after film forming or at a last step of TFT fabrication steps. The heating treatment has results in that a fluctuation of TFT properties within a set of TFT is prevented, and drive stability is improved.

2. Display

The field effect-type thin film transistor according to the invention is preferably used for an image display with a liquid crystal or EL device incorporated therein, and particularly for a flat panel display (Flat Panel Display: FPD). More preferably, it is used for a flexible display in which a flexible substrate such as an organic plastic film is used as its substrate. Particularly, the field effect-type thin film transistor according to the invention has a high mobility, and therefore it is most preferably used for a display incorporating an organic EL device, a flexible organic EL display.

(Applications)

The field effect-type thin film transistor according to the invention can be used in an image display with a liquid crystal or EL device incorporated therein, and especially it can be used as a switching device or a driving device of an FPD. It is suitable to use the field effect-type thin film transistor as a switching device or a driving device of a flexible FPD device. Further, a display incorporating the field effect-type thin film transistor according to the invention has such wide ranging applications as a mobile phone display, a personal digital assistant (PDA), a computer display, a car information display a TV monitor, and general illumination.

In addition to displays, the field effect-type thin film transistor according to the invention can be applied extensively to e.g., IC cards, and ID tags, in which the field effect-type thin film transistor is formed on a flexible substrate such as an organic plastic film.

All publications, patent applications, and technical standards mentioned in this specification are herein incorporated by reference to the same extent as if each individual publication, patent application, or technical standard was specifically and individually indicated to be incorporated by reference.

EXAMPLES

The thin film field effect transistor according to the invention will be described below based on the examples. However, the invention is not limited to the examples.

Example 1

1. Preparation of Electric Resistance Layer and Active Layer
<Condition 1>

Using a polycrystalline sintered compact having a composition of $InGaZnO_4$ as a target, RF magnetron sputtering vacuum deposition was performed under the condition where argon (Ar) and oxygen ($O_2$) flow rates are 12 sccm and 0.2 sccm respectively, an RF power is 200 watts, and a pressure is 0.4 Pa.
<Condition 2>

RF magnetron sputtering vacuum deposition was performed under conditions similar to Condition 1 except that the $O_2$ flow rate was changed to 0.6 seem.

were analyzed by the conventional X-ray diffraction. As a result, it was verified that the resultant films were amorphous films. Further, the samples for measurements of physical properties were measured in electric conductivity, and their carrier concentrations and composition ratios were measured by Hall measurements. Table 1 shows the results of the measurements.

—Method of Measuring Electric Conductivity—

The electric conductivity of the sample for measurement of physical properties was determined by calculation based on measured sheet resistance and film thickness of the sample. Here, when the sheet resistance is expressed by $\rho$ ($\Omega/\square$), and the thickness is expressed by d (cm), the electric conductivity $\sigma$ ($Scm^{-1}$) is calculated by the equation $\sigma = 1/(\rho \times d)$.

In the Example, in an environment of 20° C., the measurements were executed by a Loresta GP (manufactured by Mitsubishi Chemical Corp.) for the region of the samples for measurement of physical properties with sheet resistance less than $10^7$ ($\Omega/\square$), and the measurements were executed by a Hiresta UP (manufactured by Mitsubishi Chemical Corp.) for the region of sheet resistance of $10^7$ ($\Omega/\square$) or more. For measurements of film thickness of the samples for measurement of physical properties, a contact stylus-type surface profiler DekTak-6M (manufactured by ULVAC, Inc.) was used.

—Measurements of Carrier Concentrations by Hall Effect Measurements—

Carrier concentrations of the samples for measurements of physical properties were determined using a ResiTest8300 (manufactured by TOYO Corporation) to make Hall effect measurements. The Hall effect measurements were performed under an environment of 20° C. It is noted that not only the carrier concentration but also the hole mobility of carriers could be determined by making Hall effect measurements.

—Method of Measuring Composition Ratio—

The composition ratios of the samples for measurements of physical properties were determined by RBS (Rutherford Backscattering Spectrometry) analysis.

TABLE 1

| Condition No. | $O_2$ Flow Rate (sccm) | Electric Conductivity ($Scm^{-1}$) | Electron Carrier concentration ($cm^{-3}$) | Hole Mobility ($cm^2/Vs$) | Composition Ratio of In:Ga:Zn |
|---|---|---|---|---|---|
| 1 | 0.2 | $4.0 \times 10^1$ | $3 \times 10^{19}$ | 8.3 | 1.0:0.96:0.54 |
| 2 | 0.6 | $2.6 \times 10^{-1}$ | $3 \times 10^{17}$ | 4.9 | |
| 3 | 1.4 | $5.7 \times 10^{-3}$ | $1 \times 10^{16}$ | 3.0 | |
| 4 | 1.5 | $1.0 \times 10^{-4}$ | $5 \times 10^{14}$ | 1.3 | 1.0:0.93:0.57 |
| 5 | 1.8 | $1.1 \times 10^{-9}$ | $<10^{11}$ | — | 1.0:0.95:0.63 |

<Condition 3>

RF magnetron sputtering vacuum deposition was performed under conditions similar to Condition 1 except that the $O_2$ flow rate was changed to 1.4 seem.
<Condition 4>

RF magnetron sputtering vacuum deposition was performed under conditions similar to Condition 1 except that the $O_2$ flow rate was changed to 1.5 seem.
<Condition 5>

RF magnetron sputtering vacuum deposition was performed under conditions similar to Condition 1 except that the $O_2$ flow rate was changed to 1.8 seem.

Samples for measurements of physical properties were prepared under Conditions 1 to 5, in which a layer of 100 nm was provided directly on a non-alkali glass substrate (Corning #1737). The samples for measurements of physical properties It is shown from Table 1 concerning sputter films of an oxide semiconductor $InGaZnO_4$ that increasing the oxygen flow rate during sputtering, i.e., the oxygen concentration in the sputter film, decreases the electric conductivity and the hole mobility. In addition, regarding the composition ratio it is shown that increasing the Zn/In ratio reduces the electric conductivity and hole mobility.

2. Preparation of TFT Devices

Inventive TFT Device Nos. 1 and 2 and Comparative TFT Devices Nos. 1 and 2 were prepared. The cross-sectional structure of the Inventive TFT Device Nos. 1 and 2 and Comparative TFT Devices Nos. 1 and 2 are shown in As the substrate, a non-alkali glass plate (Corning No. 1737) was used. The substrate was subjected to ultrasonic cleaning with pure water for 15 minutes, with acetone for 15 minutes, and again with pure water for 15 minutes in this order. On the resultant substrate, an ITO thin Film (with a thickness of 30 nm) used for a gate electrode was formed by RF magnetron sputtering using an indium-tin oxide (ITO) target (indium:tin=95:5 in molar ratio), whose SnO$_2$ content was 10% by weight (under the conditions: film-forming temperature of 43° C.; Ar sputter gas with a flow rate of 12 sccm; RF power of 40 watts; and film-forming pressure of 0.4 Pa). Patterning of ITO for the gate electrode was performed using a shadow mask during sputtering.

Subsequently, on the gate electrode, a gate insulating layer was formed as described below.

The gate insulating layer was provided by performing RF magnetron sputtering vacuum deposition of SiO$_2$ to form a 200-nm film (under the conditions: a target of SiO$_2$; film-forming temperature of 54° C.; Ar sputter gas with flow rate of 12 sccm; O$_2$ sputter gas with flow rate of 2 sccm; RF power of 400 watts; and film-forming pressure of 0.4 Pa). Patterning of SiO$_2$ for the gate insulating layer was performed using a shadow mask during sputtering.

Over this, a set of an electric resistance layer and an active layer comprising InGaZnO$_4$ were provided. In Table 2 are shown deposit conditions of the electric resistance layer and the active layer and deposit thicknesses in the Inventive TFT Device Nos. 1 and 2 and Comparative TFT Device Nos. 1 and 2. The details of deposit conditions of the electric resistance layer and the active layer were as described in "1. Preparation of electric resistance layer and active layer" above. Patterning of InGaZnO$_4$ in the electric resistance layer and the active layer was performed by a means similar to the means described above, i.e., using a shadow mask during sputtering.

Subsequently, over the electric resistance layer and the active layer, ITO for source electrode and the drain electrode was deposited to a thickness of 40 nm by RF magnetron sputtering (under the conditions: film-forming temperature 43° C.; an Ar sputter gas with flow rate 12 sccm; RF power 40 watts; and film-forming pressure 0.4 Pa). Patterning of the source electrode and the drain electrode was performed using a shadow mask during sputtering. Thus, the Inventive TFT Device Nos. 1 and 2 and Comparative TFT Device Nos. 1 and 2, each of which has a reversed stagger structure with a channel length L of 200 μm and a channel width W of 1000 μm, were prepared.

3. Performance Evaluation

In regard to the TFT devices thus obtained, measurements of TFT transfer characteristics were performed at a saturation region drain voltage V$_d$=40 V (gate voltage satisfying: −20 V<V$_g$<40 V) to evaluate the field effect mobility and ON-OFF ratios of the TFTs. The measurements of TFT transfer characteristics were performed using a semiconductor parameter analyzer 4156C (manufactured by Agilent Technologies, Inc.).

Figure 5:
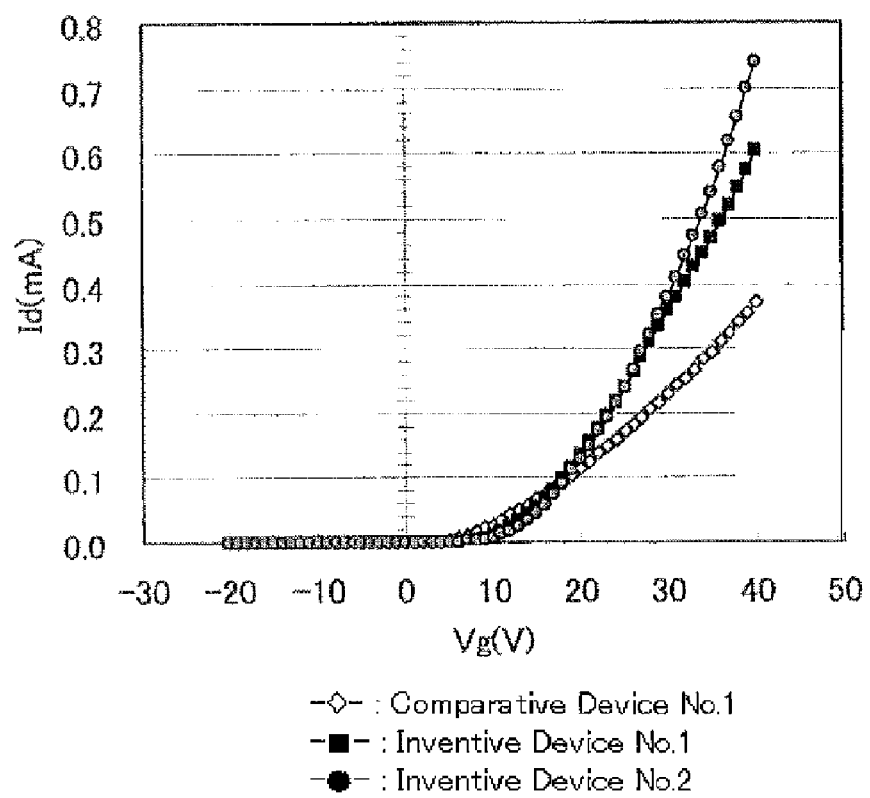
FIG. 5 is a graph showing characteristic curves of current-voltage characteristics of TFT devices having reversed stagger structure, in which the horizontal axis indicates gate voltage (Vg), and the vertical axis indicates drain current (Id).

FIG. 5 shows current-voltage characteristic curves showing the TFT transfer characteristics of the devices, in which the horizontal axis indicates gate voltage V$_g$ and the vertical axis indicates drain current Id.

—Method of Calculating Field Effect Mobility—

The field effect mobility μ in a saturation region can be determined from the TFT transfer characteristics with the following expression:

$$\mu = (2\,L/W \times C_{ox}) \times (\partial Id^{1/2}/\partial Vg),$$

wherein L denotes the channel length, W denotes the channel width, C$_{ox}$ denotes the electrostatic capacity of a gate insulating layer, and Id denotes a drain current, and Vg denotes gate voltage.

—Method of Calculating ON-OFF Ratio—

The ON-OFF ratios were determined from the TFT transfer characteristics; specifically, from the ratio of the maximum value Id$_{max}$ of the drain current Id to the minimum value Id$_{min}$ of the drain current Id, i.e., Id$_{max}$/Id$_{min}$.

The TFT characteristics obtained from the results of the measurements of TFT transfer characteristics shown in FIG. 5 are presented in Table 2. From the results shown in Table 2, it is shown that the Inventive Device Nos. 1 and 2 have higher field effect mobility and higher ON-OFF ratios, and are superior in performance to the devices for comparison. On the other hand, Comparative Device No. 1 whose active layer consists of one layer with medium conductivity has low field effect mobility. Further, Comparative Device No. 2, wherein the active layer and the electric resistance layer are changed each other, that is, the active layer having low electric conductivity and the electric resistance layer having high electric conductivity, has an extremely low ON-OFF ratio.

As is clear from the above, it is found that when a TFT device is arranged according to the invention so that the active layer has a high electric conductivity and the electric resistance layer has a low electric conductivity, the device exhibits high field effect mobility and a large ON-OFF ratio, and therefore has unexpectedly superior performance.

TABLE 2

| Device No. | Substrate | Gate Electrode/ Thickness | Active Layer Deposit Condition No. | Active Layer Thickness (nm) | Electric Resistance Layer Deposit Condition No. | Electric Resistance Layer Thickness (nm) | Device Performance Mobility (cm$^2$/Vs) | Device Performance ON-OFF Ratio |
|---|---|---|---|---|---|---|---|---|
| Inventive Device No. 1 | Glass | ITO/30 nm | 2 | 10 | 4 | 40 | 15.3 | $1.4 \times 10^6$ |
| Inventive Device No. 2 | Glass | ITO/30 nm | 1 | 10 | 4 | 40 | 17.2 | $2.7 \times 10^6$ |
| Comparative Device No. 1 | Glass | ITO/30 nm | 3 | 50 | — | — | 4.3 | $9.0 \times 10^5$ |
| Comparative Device No. 2 | Glass | ITO/30 nm | 4 | 10 | 1 | 40 | 4.2 | 1.4 |
| Inventive Device No. 3 | Glass | Mo/40 nm | 2 | 30 | 5 | 20 | 33.2 | $3.4 \times 10^6$ |
| Inventive Device No. 4 | PEN | Mo/40 nm | 1 | 10 | 4 | 40 | 21.1 | $2.2 \times 10^6$ |

Example 2

1. Preparation of TFT Device 3 of the Invention

The Inventive TFT Device No. 3 was prepared according to the preparation of Inventive TFT Device #1 except for the following: the 30 nm-thick ITO film constituting the gate electrode was changed to a 40 nm-thick molybdenum film, and the electric resistance layer was prepared according to the Condition 5 for preparation of electric resistance layer in Example 1. Further, the thicknesses of the electric resistance layer and the active layer were changed to 30 nm and 20 nm respectively. The molybdenum film was formed by a DC magnetron sputtering deposition method (under the sputtering conditions: DC power of 380 watts; Ar sputter gas with a flow rate of 12 sccm; and pressure of 0.4 Pa).

2. Performance Evaluation

The Device No. 3 was evaluated with respect to TFT device performance in a manner similar to Example 1. Results of the evaluation are presented in Table 2.

Inventive TFT Device No. 3 was found to have still higher field effect mobility and still higher ON-OFF ratio, and had performance superior to the Inventive TFT Device Nos. 1 and 2. However, when the measurement of the TFT transfer characteristics was performed repeatedly, it was shown that the Inventive TFT Device Nos. 1 and 2 had less deterioration in ON-OFF ratio and were superior in durability to Inventive TFT Device No. 3.

Example 3

1. Preparation of TFT Device No. 4 of the Invention

Inventive TFT Device No. 4 was prepared in a similar manner to the process in the preparation of Inventive TFT Device No. 1 except for the following: a film with a barrier comprising insulating layers with a barrier function made of polyethylene naphthalate on both sides of the film was used as the substrate, and the 30 nm-thick ITO film which becomes the gate electrode formed over the barrier film was changed to a 40 nm-thick molybdenum film. The molybdenum film was formed under conditions similar to Example 2.

The insulating layer was provided by performing deposition of SiON to form a film having a thickness of 500 nm. SiON was deposited by an RF magnetron sputtering method (under the sputtering conditions: a target of $Si_3N_4$; RF power of 400 watts; Ar gas with flow a rate of 12 sccm; $O_2$ gas with a flow rate of 3 sccm; and film-forming pressure of 0.45 Pa).

2. Performance evaluation

The Device No. 4 was evaluated with respect to TFT device performance in a manner similar to Example 1. Results of the evaluation are presented in Table 2.

Inventive TFT Device No. 4 exhibited field effect mobility and an ON-OFF ratio which were comparable to those of Inventive TFT Device No. 1 prepared on a glass substrate. From this fact, it is shown that the TFT device according to the invention exhibits excellent high mobility and a large ON-OFF ratio even when it is provided on a flexible substrate composed of an organic plastic film.

Example 4

1. Preparation of TFT device of the Invention

Figure 21:
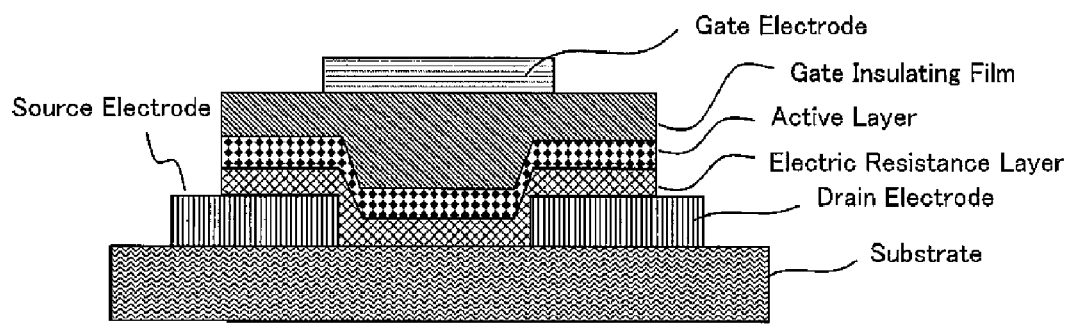
FIG. 21 is a schematic diagram showing the cross-sectional structure of a TFT device of Example 4.

A top gate type TFT device according to the invention was prepared following the procedures. The cross-sectional structure of the TFT device of the Example is shown in FIG. 21.

A non-alkali glass plate (Corning No. 1737) was used as the substrate as in Example 1, on which an ITO film was formed (to a thickness of 40 nm) for source electrode and drain electrode. The ITO film was formed under the same conditions as those in Example 1. Patterning of the source electrode and drain electrode was performed using a shadow mask as in Example 1.

On this, an electric resistance layer with a thickness of 40 nm was provided under Condition 4, and an active layer with a thickness of 10 nm was provided thereon under Condition 1 in Example 1. Patterning of these layers was performed using a shadow mask as in Example 1.

Further, on this, a 200 nm-thick film of $SiO_2$ was provided as a gate insulating layer. The film of $SiO_2$ was formed under the same conditions as in Example 1. Patterning of the gate insulating layer was carried out using a shadow mask as in Example 1.

Subsequently, ITO with a thickness of 30 nm was provided as a gate electrode. The ITO film was formed under the same conditions as in the Example 1. Patterning of the gate electrode was performed using a shadow mask as in Example 1.

Thus, a top gate type TFT device which had a channel length L of 200 μm and a channel width W of 1000 μm was obtained.

2. Performance Evaluation

The device was evaluated with respect to TFT device performance as in Example 1. As a result, the field effect mobility was 17.7 $cm^2$/Vs, and the ON-OFF ratio was $3 \times 10^6$. Hence, even in the case of a top gate type TFT, excellent high mobility and a large ON-OFF ratio were achieved.

Example 5

Figure 22:
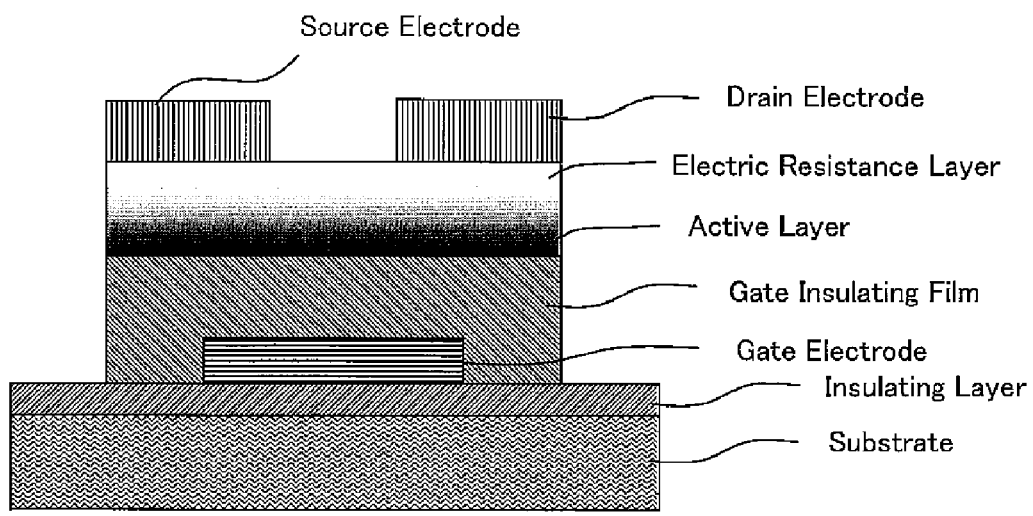
FIG. 22 is a schematic diagram showing the cross-sectional structure of a TFT device of Example 5.

A TFT device was prepared by procedures similar to Example 1, except that the preparation of the electric resistance layer and the active layer in Example 3 was changed as follows. According to the conditions given below, the active layer was formed to have a structure such that its electric conductivity was made high in the region adjacent to the gate insulating layer, and low in the region of the electric resistance layer adjacent to the source electrode and the drain electrode, continuously changing the electric conductivity in the region therebetween. FIG. 22 shows the cross-sectional structure of the TFT device of the Example.

<Condition for Preparing Electric Resistance Layer and Active Layer>

A target of $InGaZnO_4$ was used as a target to prepare the continuous electric resistance layer and active layer using the same sputtering system as in Example 1. Under the sputtering conditions: RF power of 200 watts, Ar sputter gas with a flow rate of 12 sccm, and pressure of 0.4 Pa, the layer was formed to a thickness of 50 nm while continuously changing the oxygen flow rate from 0.6 sccm to 1.8 sccm.

<Performance Evaluation>

The resultant TFT device thus prepared was evaluated as in Example 1. As a result, the device showed excellent TFT characteristics, i.e., mobility of 8.9 $cm^2$/Vs, and an ON-OFF ratio of $1.0 \times 10^6$.

What is claimed is:

1. A thin film field effect transistor comprising at least a gate electrode, a gate insulating layer, an active layer, a source electrode and a drain electrode on a substrate, wherein an electric resistance layer is provided between the active layer and at least one of the source electrode or the drain electrode, the electric resistance layer has an electric conductivity lower than that of the active layer, the active layer includes an oxide semiconductor, the electric resistance layer is thicker than the active layer, the electric resistance layer includes an oxide semiconductor, and a ratio of a thickness of the electric resistance layer to that of the active layer is more than 1 and less than or equal to 10.

2. The thin film field effect transistor according to claim 1, wherein the active layer is in contact with the gate insulating layer, and the electric resistance layer is in contact with at least one of the source electrode or the drain electrode.

3. The thin film field effect transistor according to claim 1, wherein the electric conductivity continuously changes between the electric resistance layer and the active layer in the active layer.

4. The thin film field effect transistor according to claim 1, wherein the oxide semiconductor included in the active layer comprises an amorphous oxide semiconductor.

5. The thin film field effect transistor according to claim 1, wherein the oxide semiconductor included in the electric resistance layer comprises an amorphous oxide semiconductor.

6. The thin film field effect transistor according to claim 1, wherein the oxide semiconductor comprises an amorphous semiconductor.

7. The thin film field effect transistor according to claim 6, wherein the active layer has an oxygen concentration lower than that of the electric resistance layer.

8. The thin film field effect transistor according to claim 6, wherein the oxide semiconductor includes at least one material selected from the group consisting of indium, gallium and zinc, or a composite oxide of a combination of materials selected from the group consisting of indium, gallium and zinc.

9. The thin film field effect transistor according to claim 8, wherein the oxide semiconductor includes indium and zinc, and a composition ratio of zinc (Zn) to indium (In), i.e., Zn/In, in the electric resistance layer is larger than that in the active layer.

10. The thin film field effect transistor according to claim 1, wherein the electric conductivity of the active layer is $10^{-1}$ $Scm^{-1}$ or more and less than $10^2$ $Scm^{-1}$.

11. The thin film field effect transistor according to claim 1, wherein a ratio of the electric conductivity of the active layer to the electric conductivity of the electric resistance layer (i.e., the electric conductivity of the active layer/ the electric conductivity of the electric resistance layer) is from $10^2$ to $10^8$.

12. The thin film field effect transistor according to claim 1, wherein the substrate is a flexible resin substrate.

13. A display comprising the thin film field effect transistor according to claim 1.

* * * * *